(12) United States Patent
Kim et al.

(10) Patent No.: US 7,956,533 B2
(45) Date of Patent: Jun. 7, 2011

(54) ORGANIC ELECTROLUMINESCENT DISPLAY DEVICE AND MANUFACTURING METHOD THEREOF

(75) Inventors: Keum-Nam Kim, Suwon-si (KR); Ul-Ho Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1287 days.

(21) Appl. No.: 10/984,097

(22) Filed: Nov. 9, 2004

(65) Prior Publication Data

US 2005/0110422 A1 May 26, 2005

(30) Foreign Application Priority Data

Nov. 24, 2003 (KR) .................. 10-2003-0083589
Jan. 6, 2004 (KR) .................. 10-2004-0000594

(51) Int. Cl.
*H01J 1/62* (2006.01)
*H01J 63/04* (2006.01)

(52) U.S. Cl. ......... 313/506; 313/498; 313/503; 313/512
(58) Field of Classification Search ........... 313/498–512
See application file for complete search history.

(56) References Cited

U.S. PATENT DOCUMENTS

| | | | |
|---|---|---|---|
| 5,920,082 A | 7/1999 | Kitazawa et al. | |
| 6,268,894 B1 | 7/2001 | Aoki et al. | |
| 6,690,033 B2 | 2/2004 | Yamazaki et al. | |
| 2002/0153844 A1 | 10/2002 | Koyama | |
| 2003/0137255 A1 | 7/2003 | Park et al. | |
| 2004/0113544 A1* | 6/2004 | Murakami et al. | 313/504 |
| 2004/0263072 A1* | 12/2004 | Park et al. | 313/509 |

FOREIGN PATENT DOCUMENTS

| | | |
|---|---|---|
| CN | 1341970 A | 3/2002 |
| EP | 1 128 439 A2 | 8/2001 |
| JP | 2001-318628 | 11/2001 |
| JP | 2001318628 A * | 11/2001 |
| JP | 2003-255858 | 9/2003 |
| KR | 1997-0002412 | 1/1997 |
| KR | 1997-0022459 | 5/1997 |
| KR | 10-0235475 | 9/1999 |
| KR | 2000-0005852 | 1/2000 |
| KR | 2003-0067547 | 8/2003 |

OTHER PUBLICATIONS

Korean Patent Abstracts for Publication No. 1020030067547; Date of publication of application Aug. 14, 2003, in the name of Shingo Ishihara et al.

(Continued)

*Primary Examiner* — Joseph L Williams
*Assistant Examiner* — Kevin Quarterman
(74) *Attorney, Agent, or Firm* — Christie, Parker & Hale, LLP (57) ABSTRACT

An electroluminescent display device includes a display panel having scan lines, data lines, and pixel circuits. The pixel circuit includes an electroluminescent element having a first electrode layer, a first insulation film, and an emitting layer for displaying images. A driving circuit is coupled to the electroluminescent element. The first electrode layer is superimposed on a power source line, a scan line, or both, with a second insulation film therebetween.

10 Claims, 9 Drawing Sheets

OTHER PUBLICATIONS

European Patent Search Report, for application No. 04090458.3, dated Apr. 8, 2005, in the name of Samsung SDI Co., Ltd.

Patent Abstracts fo Japan, Publication No. 2001-318628, dated Nov. 16, 2001, in the name of Shunpei Yamazaki et al.

Patent Abstracts fo Japan, Publication No. 2003-255858, dated Sep. 10, 2003, in the name of Ryuji Nishikawa et al.

Korean Patent Abstracts for Korean Patent Application No. 1997-0002412, Publication No. 1019970002412 B1; Date of Publication: Mar. 5, 1997.

Korean Patent Abstracts, Publication No. 1020000005852 A; Date of Publication: Jan. 25, 2000; in the name of Yasyuki Hanajawa et al.

* cited by examiner

ORGANIC ELECTROLUMINESCENT DISPLAY DEVICE AND MANUFACTURING METHOD THEREOF

CROSS REFERENCE TO RELATED APPLICATION

This application claims priority to and the benefit of Korea Patent Application No. 10-2003-0083589 filed on Nov. 24, 2003 and No. 10-2004-0000594 filed on Jan. 06, 2004 in the Korean Intellectual Property Office, the entire content of which is incorporated herein by reference.

BACKGROUND OF THE INVENTION (a) Field of the Invention

The present invention relates to a display device. More specifically, the present invention relates to an organic electroluminescent (EL) display device with an improved aperture ratio.

(b) Description of the Related Art

The organic EL display device, which is a display device for electrically exciting a fluorescent organic compound to emit light, has organic light-emitting cells that are voltage— or current-driven to display an image. These organic, light-emitting cells have a structure composed of an anode layer, an organic thin film, and a cathode layer. To balance the electrons and holes in order to enhance luminescent efficiency, the organic thin film has a multi-layer structure that includes an emitting layer (EML), an electron transport layer (ETL), and a hole transport layer (HTL). The multi-layer structure of the organic thin film can also include an electron injecting layer (EIL) and a hole injecting layer (HIL).

Figure 1:
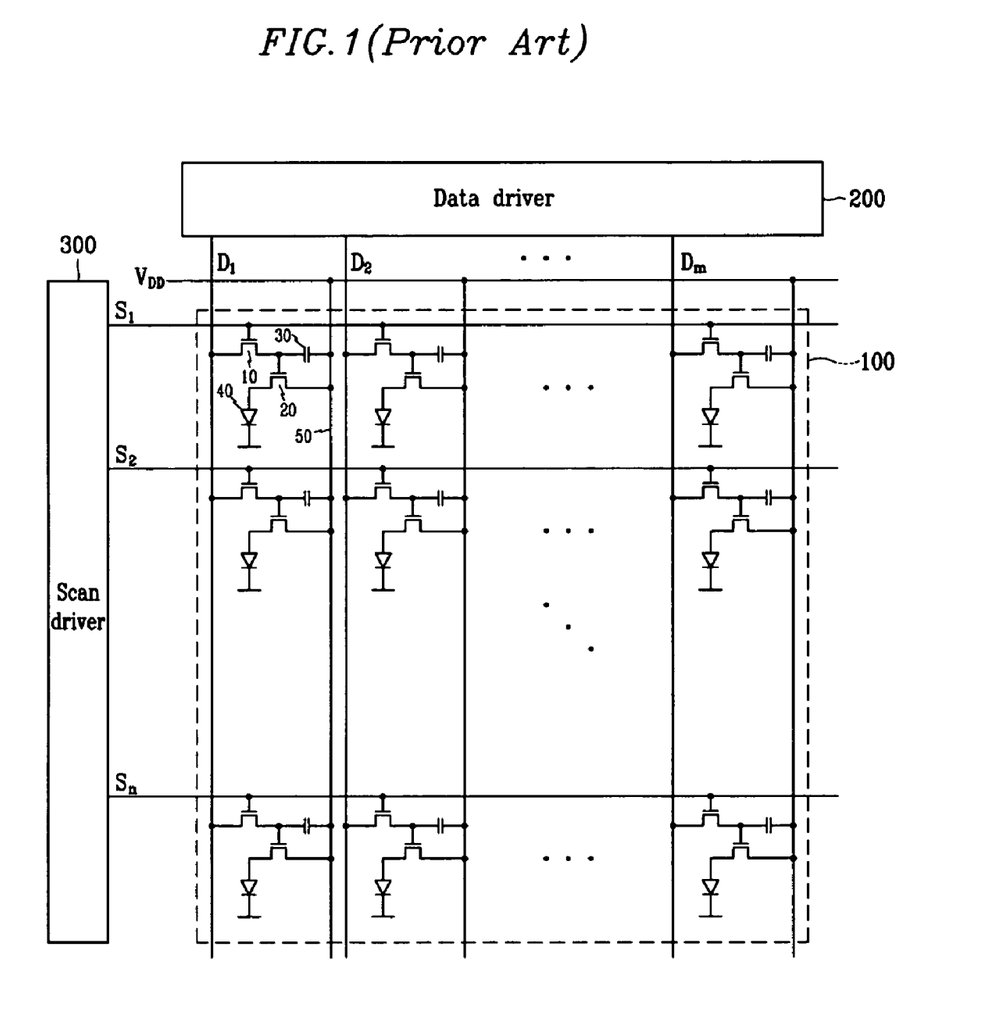
FIG. 1 shows a conventional voltage programming organic EL display device.

As shown in FIG. 1, an organic EL display device includes an organic EL display panel (referred to as "display panel" hereinafter) 100, a data driver 200, and a scan driver 300.

The display panel 100 includes a plurality of data lines D1 to Dm arranged in the column direction, a plurality of scan lines S1 to Sn arranged in the row direction, and a plurality of pixel circuits.

Each of the pixel circuits includes a driving transistor 20 for controlling the current flowing to an organic EL element 40, a switching transistor 10 for applying a voltage at the data line D1 to a gate of the driving transistor 20 in response to a select signal provided by the scan line S1, and a capacitor 30 coupled between the gate and the source of the driving transistor. The source of the driving transistor 20 is coupled to a power source line 50 for transmitting a power source voltage $V_{DD}$.

The data driver 200 supplies data voltages to the data lines D1 to Dm, and the scan driver 300 sequentially applies select signals for selecting pixel circuits to the scan lines S1 to Sn.

Figure 2:
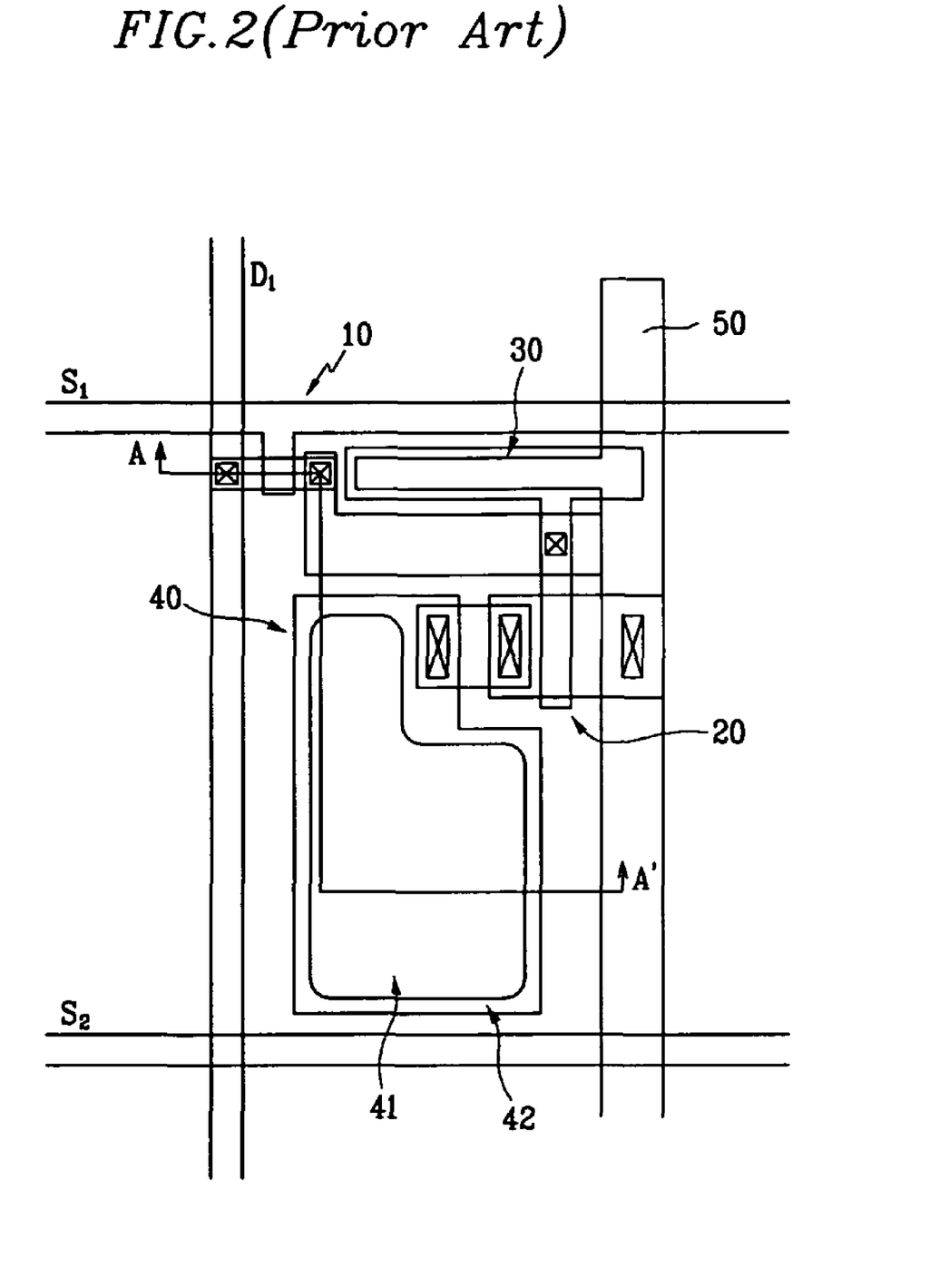
FIG. 2 shows a plan view of a pixel circuit of the organic EL display device shown in FIG. 1.
Figure 3:
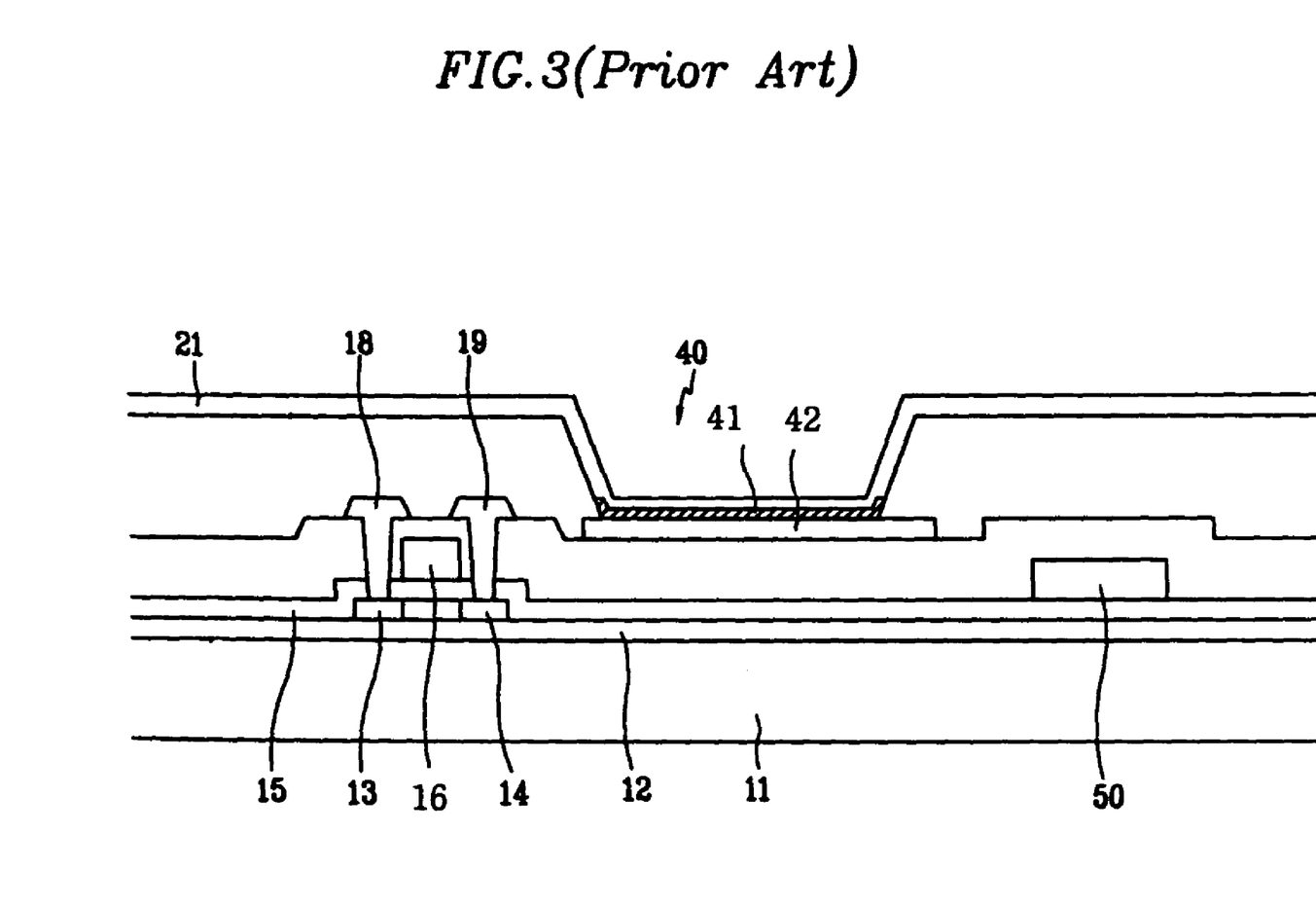
FIG. 3 shows a cross-sectional view of the part of A-A' of the pixel circuit of FIG. 2.

FIG. 2 shows a plan view of a pixel circuit coupled to the scan line S1 and the data line D1 in the organic EL display device shown in FIG. 1, and FIG. 3 shows a cross-sectional view of the part of A-A' of FIG. 2.

As shown in FIGS. 2 and 3, a gate electrode 16 of the switching transistor 10 is formed on the same electrode layer as that of the scan line S1, and a source region 13 of the switching transistor 10 is coupled to the data line D1 by a contact hole. Drain region 14 of the switching transistor 10 is coupled to a gate electrode of the driving transistor 20 through a contact hole. The drain region of the driving transistor 20 is also coupled to the power source line 50 through a contact hole, and a source region is coupled to the pixel electrode layer 42 of the organic EL element 40 by a contact.

Transparent insulation film 12 is formed on a substrate film 11. A first insulation film 15 is formed on the polycrystalline silicon layer, and a gate electrode 16 is formed to cross the polycrystalline silicon layer on the first insulation film 15.

Part of the polycrystalline silicon layer beneath the gate electrode 16 is not doped, and two parts thereof are doped with n-type dopant. The regions doped with the dopant form a source region 13 and a drain region 14 respectively, and the undoped region forms a channel region.

A source electrode 18 is formed on the source region 13, and the source region 13 is coupled to the data line D1 through the source electrode 18. A drain electrode 19 is formed on a drain region 14, and the drain electrode 19 is coupled to a gate electrode of the second transistor 20.

The organic EL element 40 comprises an organic EML 41 and a pixel electrode layer 42, such as indium tin oxide (ITO). The organic EL element 40 is positionally separated from the power source line 50. A cathode electrode 21 is formed on the organic EML 41.

The organic EML 41 is formed at a pixel region defined by an insulation film which forms an aperture on the pixel electrode layer 42. That is, since the organic EML 41 is formed within the pixel electrode layer 42, the region for forming the organic EML 41 is limited by the pixel electrode layer 42. Therefore, the narrow region of the generated organic EML 41 degrades the aperture ratio of the pixel circuit. It is therefore desirable to improve the aperture ratio of an organic EL display device.

SUMMARY OF THE INVENTION

In one embodiment of the present invention, an electroluminescent (EL) display device includes a display panel including a plurality of scan lines, a plurality of data lines, and a plurality of pixel circuits. The pixel circuit includes an EL element with a first electrode layer, a first insulation film, and an emitting layer (EML). The circuit further includes a driving circuit coupled to the EL element. The first electrode layer of the EL element is superimposed on a power source line, with a second insulation film therebetween. Within the context of this disclosure, "superimposed" indicates that the element is covering, overlapping, or aligned in a vertical direction with another element, with or without intervening elements therebetween.

In an alternate embodiment, the first electrode layer of the EL element is superimposed on the scan line with the second insulation film therebetween.

In another embodiment, a method is provided for manufacturing an EL display device that includes an EL element, a first insulation film, and a driving circuit, as described above. The method includes forming a power source line for supplying power to the driving circuit, covering the power source line with a second insulation film, forming a first electrode layer of the EL element on the second insulation film, and superimposing part of the first electrode layer on the power source line. The embodiment further includes forming a third insulation film with an aperture on a part of the first electrode layer that is spaced horizontally from the power source line, forming an emitting layer of the EL element on the aperture, and forming a second electrode layer on the emitting layer.

DETAILED DESCRIPTION

Throughout this description, thicknesses are magnified in the drawings to clearly depict the plurality of layers and regions. Similar parts or units have the same reference numerals throughout the specification. In the context of this disclosure, when a layer, a film, a region, or a substrate is described as being "on" another part, "on" should be understood to include either direct contact or coupling through at least one intervening material.

The exemplary embodiments described are applied to a rear-type light emitting display device. However, it is within the scope of the invention to apply the embodiments to front-type light emitting display devices as well.

Figure 4:
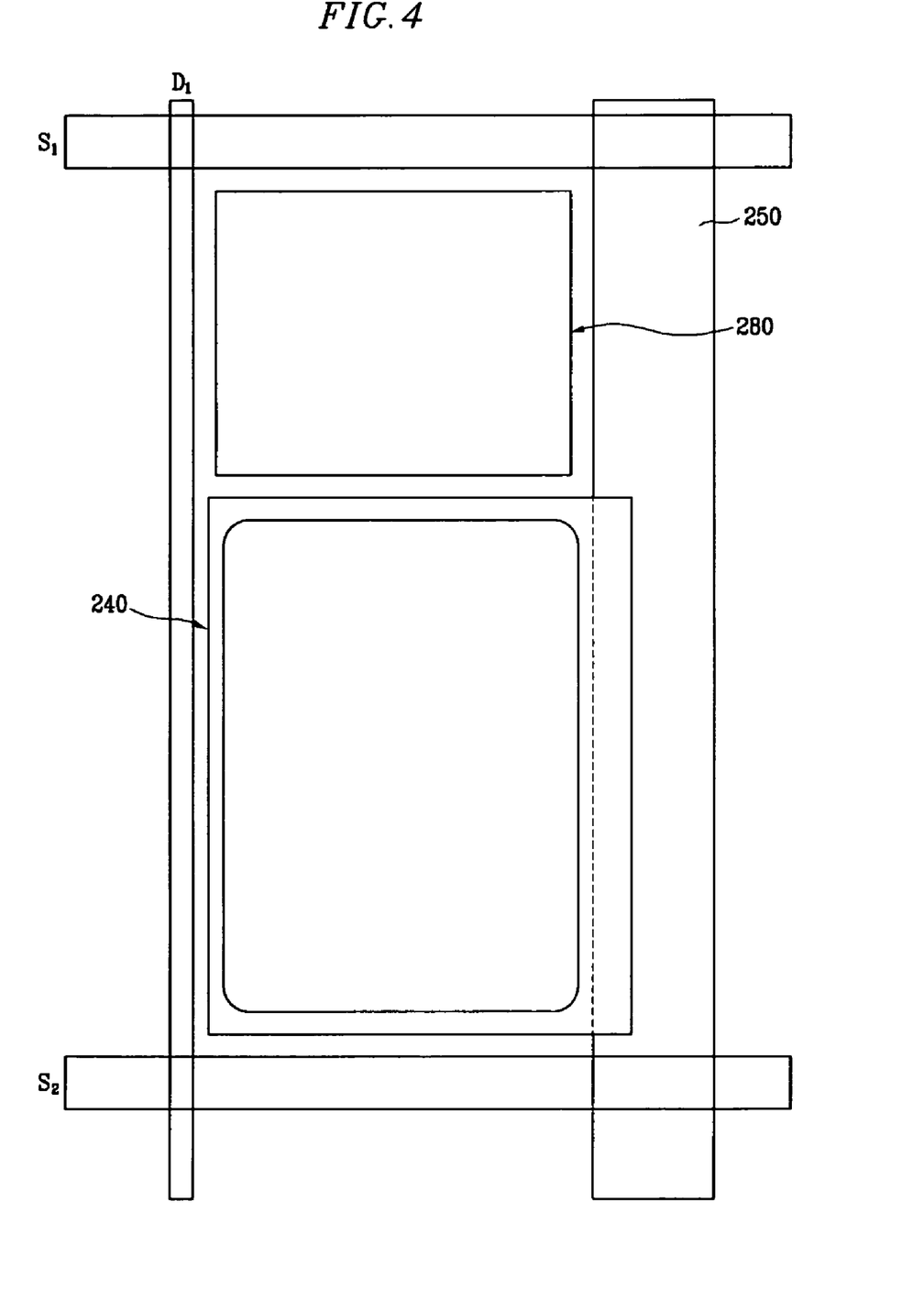
FIG. 4 shows a simplified plan view of a pixel circuit according to an exemplary embodiment of the present invention.

FIG. 4 shows a simplified plan view of a pixel circuit according to an exemplary embodiment of the present invention. For ease of description, a single pixel circuit driven by a scan line S1, a data line D1, and a power source line 250 is described.

As shown in FIG. 4, the pixel circuit comprises an organic EL element 240 for displaying images in correspondence to an amount of the applied current, and a driving circuit 280 for driving the organic EL element 240.

The organic EL element 240 comprises an organic EML, a first electrode layer for forming an anode (ITO), and a second electrode layer (not illustrated) for forming a cathode.

The driving circuit 280 can be formed by using a voltage programming or current programming driving circuit, and it controls the current flowing to the organic EL element 240 according to images signals applied to the data line to thereby represent desired images when a select signal is applied from the scan line.

The first electrode layer forming the anode is formed to be superimposed on the power source line 250. Since a constant power source voltage is applied to the power source line 250, a minor variation of data applied to the first electrode layer substantially causes no influence to the power source line 250.

Therefore, when the first electrode layer is formed to be superimposed on the power source line 250, the organic EML is formed more widely, and the aperture ratio of the organic EL display device is improved.

Figure 5:
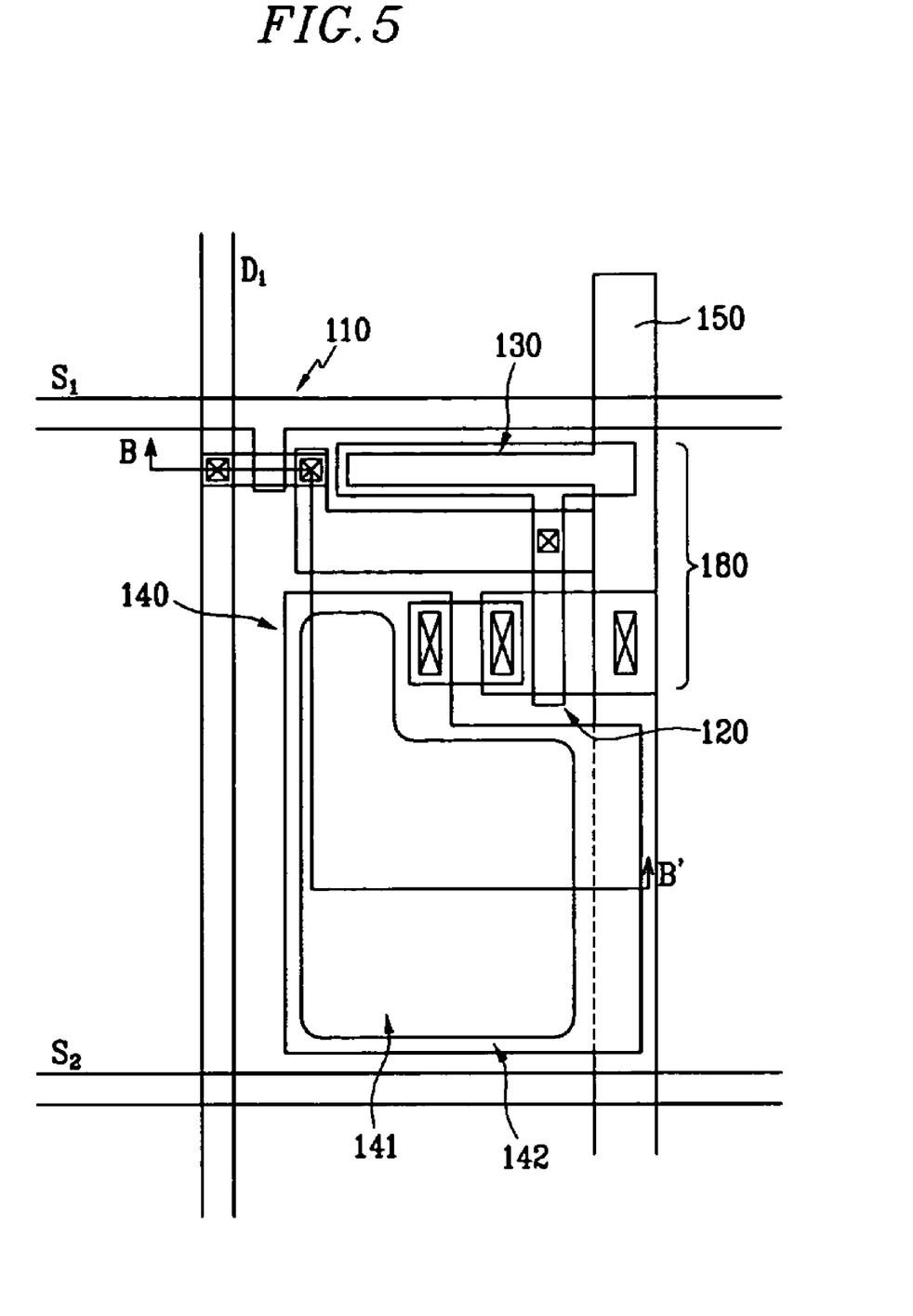
FIG. 5 shows a detailed plan view of a pixel circuit according to another exemplary embodiment of the present invention.
Figure 6:
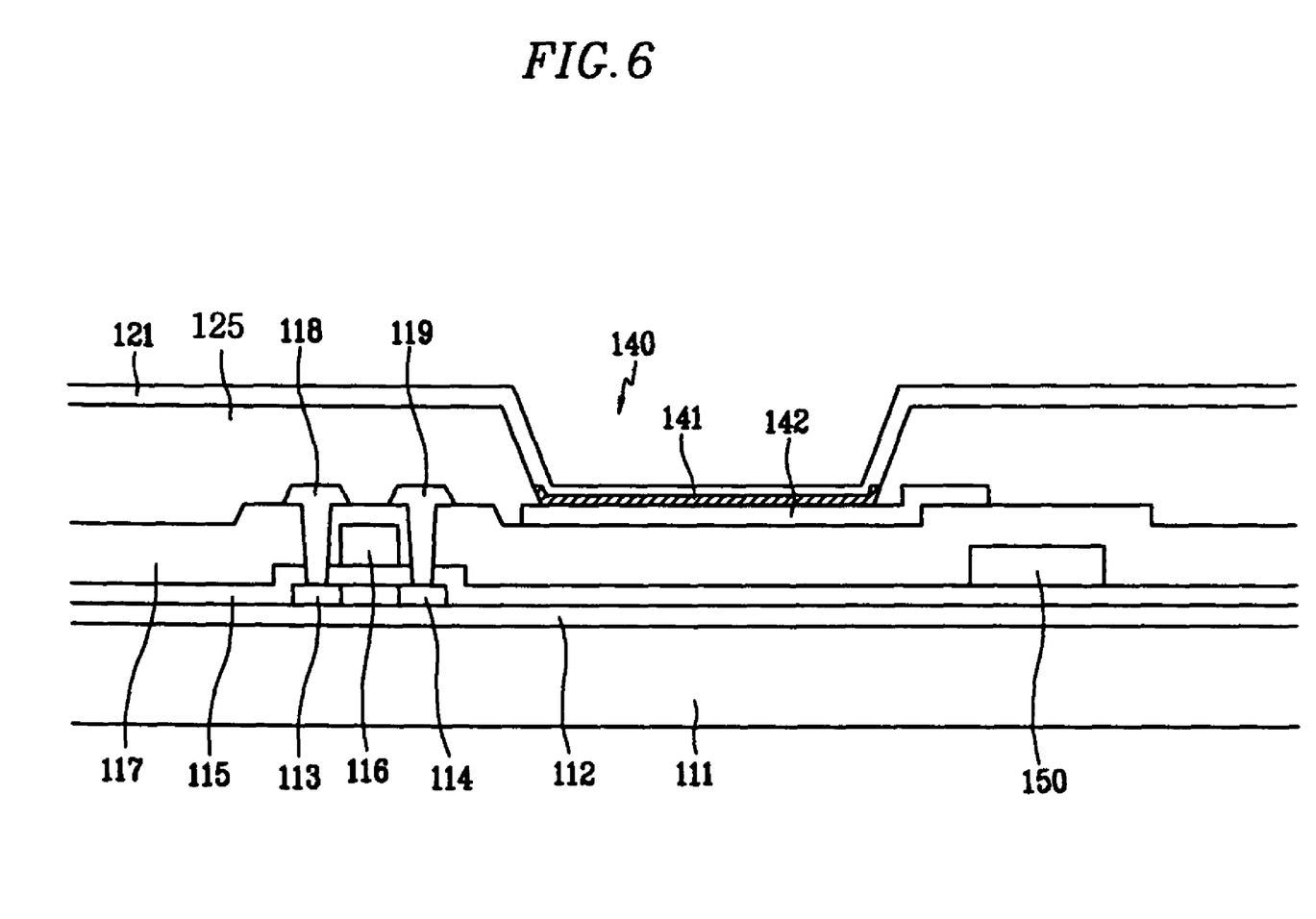
FIG. 6 shows a cross-sectional view of the part of B-B' of the pixel circuit of FIG. 5.

FIG. 5 shows a detailed plan view of a pixel circuit according to an exemplary embodiment of the present invention, and FIG. 6 shows a cross-sectional view of the part of B-B' of the pixel circuit of FIG. 5.

As shown in FIGS. 5 and 6, a driving circuit 180 comprises a driving transistor 120 for controlling the current flowing to the organic EL element 140 according to the voltage applied to a gate, a switching transistor 110 for transmitting image signals applied to the data line D1 to the driving transistor 120 in response to a select signal, and a capacitor 130.

The gate electrode 116 of the switching transistor 110 is formed on the same electrode layer as that of the scan line S1, and a source region 113 of the switching transistor 110 is coupled to the data line D1 through a contact hole. A drain region 114 of the switching transistor 110 is coupled to a gate electrode 116 of the driving transistor 120 through a contact hole.

Drain region of the driving transistor 120 is coupled to the power source line 150 by a contact hole, and a source region of the driving transistor 120 is coupled to the electrode layer 142 of the organic EL element 140 by a contact hole.

In this embodiment, an insulation film is formed between the electrode layer 142 of the organic EL element 140 and the power source line 150, and part of the electrode layer 142 is formed to be superimposed on the power source line 150 with the insulation film therebetween.

The capacitor 130 is formed by the power source line 150 and the gate electrode of the driving transistor 120.

As a result, when the switching transistor 110 is turned on by the select signal, the data voltage is transmitted to the gate of the driving transistor 120, and a predetermined current is applied to the electrode layer 142. Holes injected from the electrode layer 142 are transferred to the EML via the HTL of the organic EML 141, and electrons are injected to the EML via the ETL of the organic EML 141 from a cathode electrode layer (not illustrated). The electrons and the holes are recombined in the EML to generate excitrons, and phosphorous molecules of the EML emit light as the excitrons are modified to the ground state from the excitation state. In this instance, the emitted light is output through the transparent electrode layer 142, the insulation film, and the substrate to thus form images.

As shown, the organic EL display device is a rear-type light emitting display device in which a polycrystalline silicon layer is formed on a transparent insulation film 112. The transparent insulation film 112 is formed on a substrate film 111. A first insulation film 115 made of SiO2 or SiNx is formed on the polycrystalline silicon layer.

A gate electrode 116 made of Al and Cr is formed to cross the polycrystalline silicon layer on the first insulation film 115.

Part of the polycrystalline silicon layer beneath the gate electrode 116 is not doped, and two parts thereof are doped with n-type dopant. The regions doped with the dopant form a source region 113 and a drain region 114 respectively, and the undoped region forms a channel region.

A source electrode 118 is formed on the source region 113, and the source region 113 is coupled to the data line D1 through the source electrode 118. A drain electrode 119 is formed on a drain region 114, and the drain electrode 119 is coupled to a gate electrode of the second transistor 120.

The power source line 150 is formed on the first insulation film 115, and is covered by a second insulation film 117. The electrode layer 142 of the organic EL element 140 is formed on the second insulation film 117 between the transistor 110 and the power source line 150. The electrode layer 142 is extended to the top of the power source line 150, and a third insulation film 125 with an aperture is formed on the electrode layer 142. In this instance, the third insulation film 125 is formed to cover part of an edge of the electrode layer 142.

In the case that the organic EL display device is a rear-type light emitting display device, the aperture of the third insulation film 125 is formed on a part where the electrode layer 142 is not superimposed on the power source line 150, and an organic EML 141 is formed on the aperture of the third insulation film 125. A deposited cathode electrode 121 is formed on the organic EML 141, and the cathode electrode 121 is formed as a metallic layer.

Figure 7:
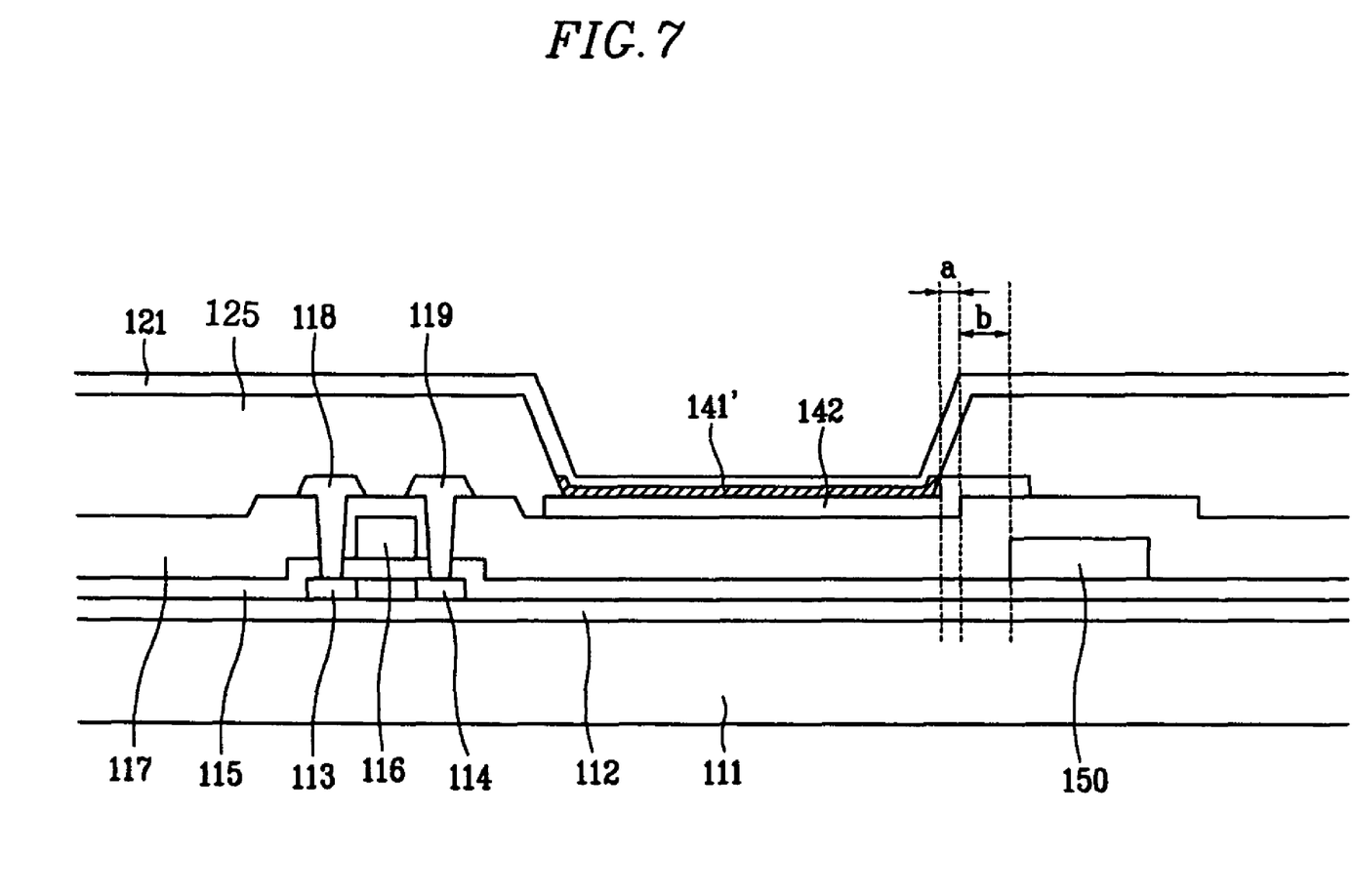
FIG. 7 shows an alternate embodiment of the cross-sectional view of the part of B-B' of the pixel circuit of FIG. 5 with a wider organic EML.

FIG. 7 shows a cross-sectional view of the part of B-B' of the pixel circuit in an alternate embodiment showing the organic EML 141' formed the most widely.

As shown, the organic EML 141' is formed nearest the power source line 150 within a range that the organic EML 141' is not bent.

When the thickness of the second insulation film 117 is defined as 'b' and the thickness of the electrode layer 142 is defined as 'a,' the aperture of the third insulation film 125 is separately formed from the power source line 150 by a distance equal to the summation of the thickness 'a' and 'b.' The aperture ratio of the organic EL display device can thereby become maximized.

The aperture ratio is increased because the organic EML 141' is formed more widely by superimposing the electrode layer 142 on the power source line 150 with the second insulation film 117 therebetween.

Figure 8:
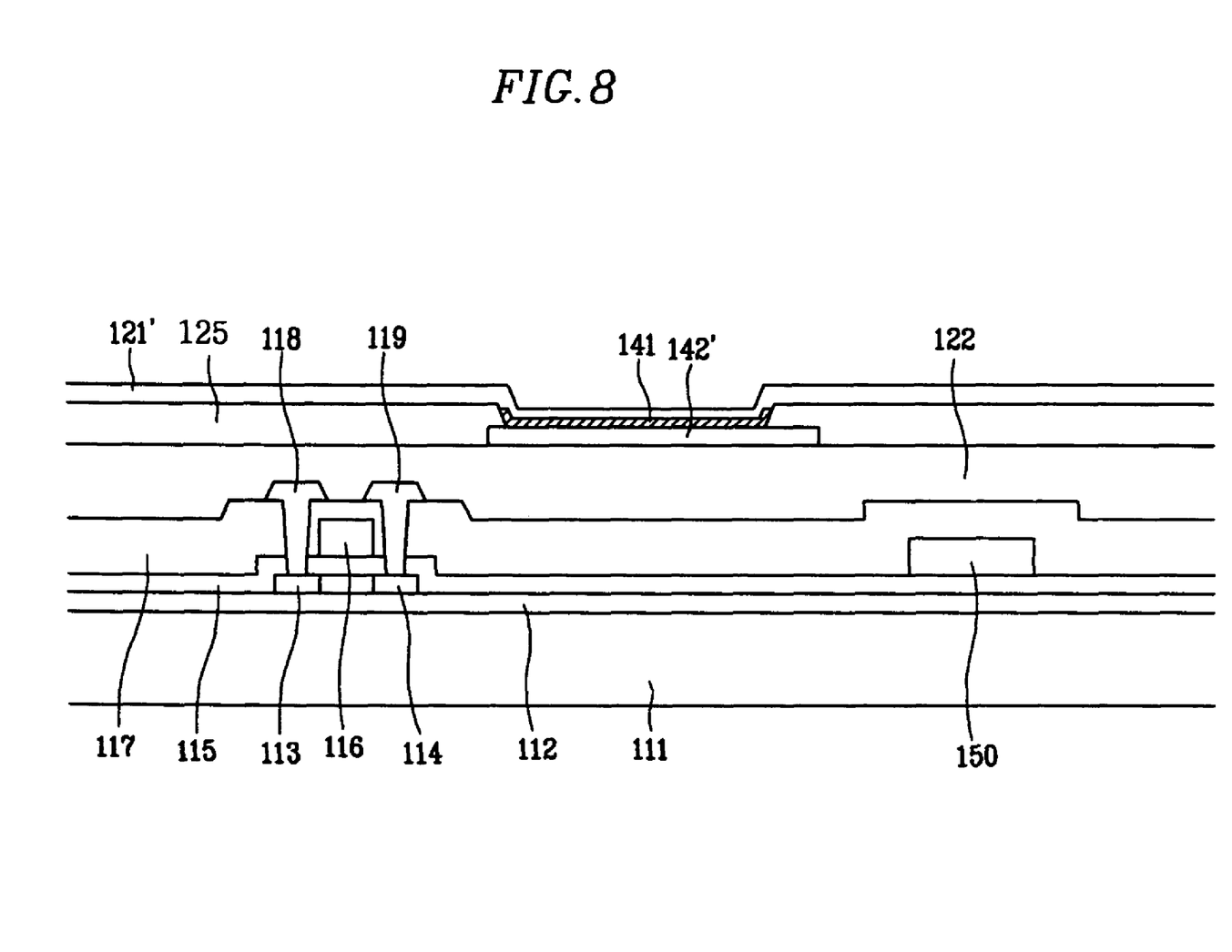
FIG. 8 shows an application of a pixel circuit according to an exemplary embodiment of the present invention to a front-type light emitting display device.

FIG. 8 applies an alternate embodiment of the pixel circuit to a front-type light emitting display device.

As shown, the case of applying the concept of the present invention to the front-type light emitting display device is different from the rear-type light emitting display device shown in FIG. 6 in that a substantially flattened film 122 is formed on the second insulation film 117.

The flattened film 122 is formed with an organic film. Also, the electrode layer 142' is formed with a metallic layer for reflecting light, and the electrode layer 121' is formed with a transparent electrode layer. The electrode layer 142' is formed to be superimposed on the power source line 150 with the second insulation film 117 therebetween.

Figure 9:
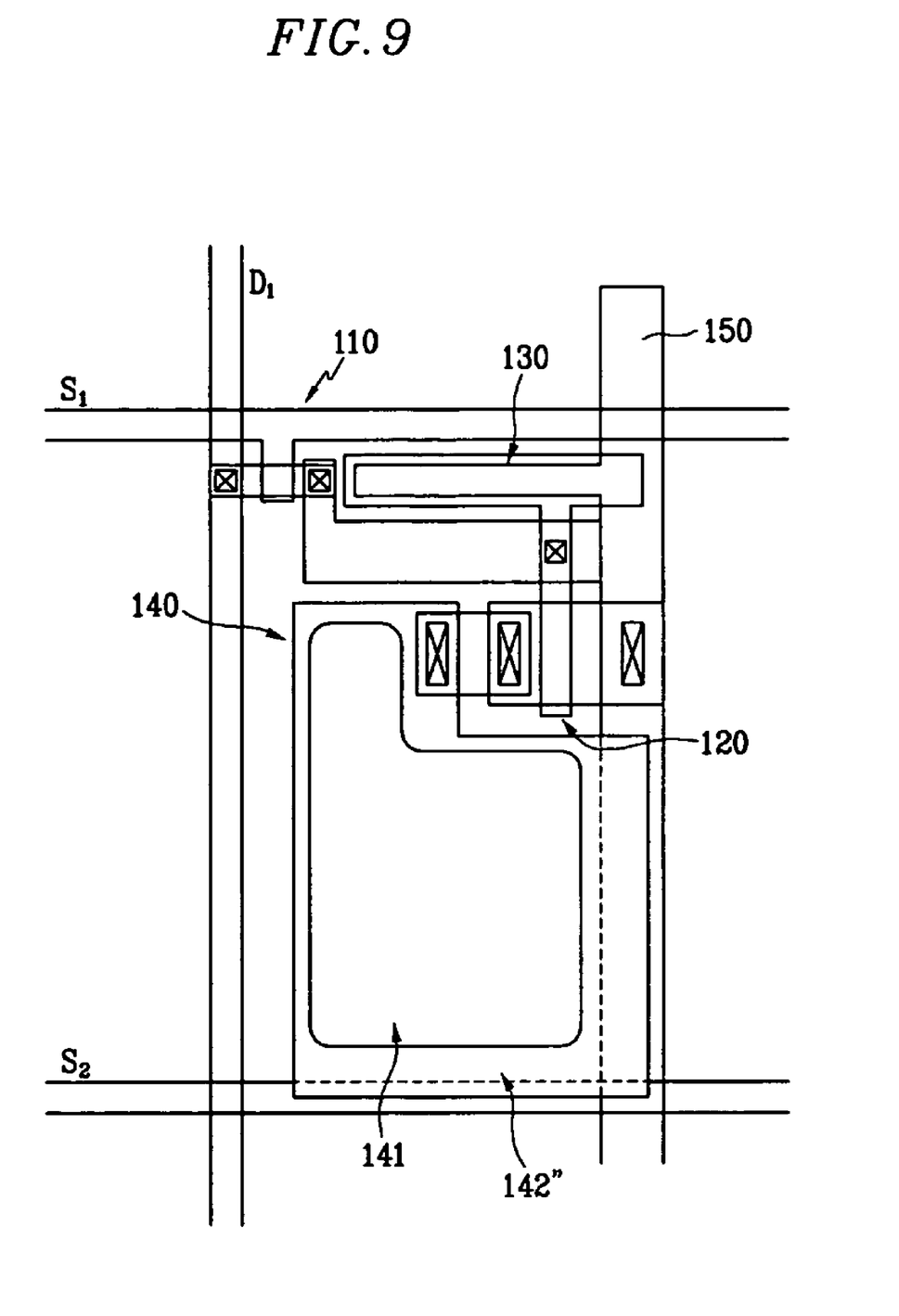
FIG. 9 shows a pixel circuit according to another exemplary embodiment of the present invention.

FIG. 9 shows a pixel circuit according to another exemplary embodiment of the present invention.

As shown, the pixel circuit is different from the pixel circuit of FIG. 5 in that the electrode layer 142" is superimposed on the power source line 150 and the scan line S2.

Since a constant voltage signal is applied to the scan line S2 during a select time of the pixel circuit, minor voltage variation caused by the electrode layer 142" substantially generates no influence to the select signal applied to the scan line S2.

The light emitting region is maximized and the aperture ratio of the organic EL display device is increased by superimposing the electrode layer 142" on the scan line S2 to which the constant voltage is applied.

The third insulation film with the aperture is formed on the electrode layer 142", and the organic EML 141 is formed on the aperture. In this embodiment, the aperture of the third insulation film is horizontally separated from the power source line 150 at least by a distance equal to the summation of the thickness of the second insulation film and the electrode layer 142".

FIG. 9 shows that the electrode layer 142" is superimposed on the next-row scan line S2. However, it is also within the scope of the invention for the electrode layer 142 to be superimposed on the current scan line S1. The electrode layer 142 can alternatively be superimposed on the next-row scan line S2 without being superimposed on the power source line 150.

Although exemplary embodiments of the present invention have been described in detail hereinabove, it should be clearly understood that many variations and/or modifications of the basic inventive concept taught herein, which may appear to those skilled in the art, will still fall within the spirit and scope of the present invention, as defined in the appended claims.

Specifically, the above-described driving circuit has been described in terms of a voltage programming circuit including a driving transistor and a switching transistor. Without being restricted to this circuit type, the driving circuit can be formed with the current programming method as well as various voltage programming methods.

The power source line 150 has been described to be a separately formed element, but it can alternatively be formed as a gate electrode of a transistor or a source/drain electrode. In these alternate embodiments, the electrode layer of the organic EL element is superimposed on the gate electrode or the source/drain electrode with an insulation film therebetween.

The above-described driving transistor and the switching transistor have been described to have N channel transistors, but one skilled in the art will realize that the switching transistor may be formed in any suitable manner including a first electrode, a second electrode, and a third electrode, with the voltage applied to the first electrode and the second electrode controlling the current flowing to the third electrode from the second electrode.

What is claimed is:

1. A bottom emission type electroluminescent display device comprising a display panel including a plurality of scan lines, a plurality of data lines, and a plurality of pixel circuits on a substrate, wherein each pixel circuit comprises:
    an electroluminescent element including a transparent electrode layer between the substrate and a reflective electrode layer comprising a metallic layer, and an emitting layer between the transparent electrode layer and the reflective electrode layer; and
    a driving circuit coupled to the electroluminescent element,
    wherein the transparent electrode layer of the electroluminescent element at least partially overlaps a power source line for supplying power to the driving circuit, with a first insulation film therebetween,
    wherein the reflective electrode layer is configured to reflect light from the emitting layer toward the substrate and through the transparent electrode for bottom emission, and
    wherein the transparent electrode layer of the electroluminescent element at least partially overlaps one of the plurality of scan lines with the first insulation film therebetween.

2. The electroluminescent display device of claim 1, wherein each pixel circuit further comprises a third insulation film which covers at least part of an edge of the transparent electrode layer and includes an aperture which is horizontally separated from the power source line.

3. An electroluminescent display device comprising a display panel including a plurality of scan lines, a plurality of data lines, and a plurality of pixel circuits, wherein each pixel circuit comprises:
    an electroluminescent element including a first electrode layer and an emitting layer; and
    a driving circuit coupled to the electroluminescent element,
    wherein the first electrode layer of the electroluminescent element is superimposed on a power source line for supplying power to the driving circuit, with a first insulation film therebetween, and
    wherein the emitting layer of the electroluminescent element is separated in a horizontal direction from the power source line by a distance equal to or greater than the summation of thicknesses of the first insulation film and the first electrode layer.

4. An electroluminescent display device comprising a display panel including a plurality of scan lines, a plurality of data lines, and a plurality of pixel circuits, wherein each pixel circuit comprises:
   an electroluminescent element including a first electrode layer and an emitting layer; and
   a driving circuit coupled to the electroluminescent element,
   wherein the first electrode layer of the electroluminescent element is superimposed on a power source line for supplying power to the driving circuit, with a first insulation film therebetween,
   wherein each pixel circuit further comprises a third insulation film which covers at least part of an edge of the first electrode layer and includes an aperture which is horizontally separated from the power source line, and
   wherein the aperture of the third insulation film is separately formed in the horizontal direction from the power source line by at least the summation of thicknesses of the first insulation film and the first electrode layer.

5. A bottom emission type electroluminescent display device comprising a display panel including a plurality of scan lines, a plurality of data lines, and a plurality of pixel circuits on a substrate, wherein each pixel circuit comprises:
   an electroluminescent element including a transparent electrode layer between the substrate and an organic emitting layer; and
   a driving circuit coupled to the electroluminescent element,
   wherein the transparent electrode layer of the electroluminescent element at least partially overlaps a scan line of the plurality of scan lines with a first insulation film therebetween.

6. The electroluminescent display device of claim 5, further comprising a reflective electrode layer, the reflective electrode layer comprising a metallic layer formed on the emitting layer, wherein the reflective electrode is configured to reflect light from the emitting layer toward the substrate and through the transparent electrode for bottom emission.

7. The electroluminescent display device of claim 5, wherein each pixel circuit further comprises a third insulation film which covers at least part of an edge of the transparent electrode layer and includes an aperture which is horizontally separated from the scan line.

8. The electroluminescent display device of claim 5, wherein each pixel circuit further comprises a power source line for supplying power to the driving circuit, and the transparent electrode layer of the electroluminescent element is superimposed on the power source line with the first insulation film therebetween.

9. An electroluminescent display device comprising a display panel including a plurality of scan lines, a plurality of data lines, and a plurality of pixel circuits, wherein each of the plurality of pixel circuits comprises:
   an electroluminescent element including a first electrode layer and an organic emitting layer; and
   a driving circuit coupled to the electroluminescent element,
   wherein the first electrode layer of the electroluminescent element at least partially overlaps a scan line of the plurality of scan lines with a first insulation film therebetween, and
   wherein the emitting layer of the electroluminescent element is separated in a horizontal direction from the scan line by a distance equal to or greater than the summation of thicknesses of the first insulation film and the first electrode layer.

10. An electroluminescent display device comprising a display panel including a plurality of scan lines, a plurality of data lines, and a plurality of pixel circuits, wherein each of the plurality of pixel circuits comprises:
   an electroluminescent element including a first electrode layer and an organic emitting layer; and
   a driving circuit coupled to the electroluminescent element,
   wherein the first electrode layer of the electroluminescent element at least partially overlaps a scan line of the plurality of scan lines with a first insulation film therebetween,
   wherein each pixel circuit further comprises a third insulation film which covers at least part of an edge of the first electrode layer and includes an aperture which is horizontally separated from the scan line, and
   wherein the aperture of the third insulation film is separated in a horizontal direction from the scan line by at least the summation of thicknesses of the first insulation film and the first electrode layer.

* * * * *